US006930040B2

(12) United States Patent
Hou et al.

(10) Patent No.: US 6,930,040 B2
(45) Date of Patent: Aug. 16, 2005

(54) METHOD OF FORMING A CONTACT ON A SILICON-ON-INSULATOR WAFER

(75) Inventors: Chuan-Ping Hou, Tainan (TW); Syun-Ming Jang, Hsin-Chu (TW); Ying-Ho Chen, Taipei (TW); Tung-Ching Tseng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 76 days.

(21) Appl. No.: 10/691,019

(22) Filed: Oct. 22, 2003

(65) Prior Publication Data

US 2005/0090096 A1 Apr. 28, 2005

(51) Int. Cl.[7] .................................................. H01L 21/44
(52) U.S. Cl. ........................................ 438/657; 438/691
(58) Field of Search ................................. 438/657, 683, 438/687, 688, 691, 700

(56) References Cited

U.S. PATENT DOCUMENTS

| 6,096,594 | A | * | 8/2000 | Lin et al. ..................... 438/238 |
| 6,184,584 | B1 | * | 2/2001 | Sakao ......................... 257/758 |
| 6,194,739 | B1 | | 2/2001 | Ivanov et al. |
| 6,221,775 | B1 | * | 4/2001 | Ference et al. ............. 438/691 |
| 6,350,661 | B2 | * | 2/2002 | Lim et al. .................... 438/424 |

OTHER PUBLICATIONS

Hu, C., "SOI and Nanoscale MOSFETs," Plenary Paper, Dept. of Electrical Engineering and Computer Sciences, University of California, Berkeley, CA.
Yang, F.L., et al., "25 nm CMOS Omega FETs," IEEE 2002.
Colinge, J.P., et al., "SOI Devices of Sub–0.1 βm Gate Lengths," Proc. 23rd International Conference on Microelectronics (MIEL 2002), vol. 1, NIS, Yugoslavia, May 12–15, 2002, pp. 109–113.

* cited by examiner

Primary Examiner—David Nelms
Assistant Examiner—Quoc Hoang
(74) Attorney, Agent, or Firm—Slater & Matsil, L.L.P.

(57) ABSTRACT

In a method of the present invention, an intermediate structure having a top surface is provided. An isolation trench is formed is the intermediate structure. Isolation material is deposited over the intermediate structure. The isolation material fills the isolation trench. Excess isolation material extends above the top surface of the intermediate structure. Part of the excess isolation material is removed until there is a predetermined thickness of isolation material remaining on the top surface of the intermediate structure. A contact opening is formed in the isolation material at the isolation trench. The contact opening extends through at least part of the intermediate structure. Contact material is deposited over the isolation material. The contact material fills the contact opening. Excess contact material, if any, that extends above the isolation material is removed. The excess isolation material is removed at least until the top surface of the intermediate structure is reached.

26 Claims, 4 Drawing Sheets

METHOD OF FORMING A CONTACT ON A SILICON-ON-INSULATOR WAFER

TECHNICAL FIELD

The present invention generally relates to the fabrication of semiconductor devices. In one aspect it relates more particularly to a process of forming a contact on a silicon-on-insulator wafer.

BACKGROUND

FIGS. 1 and 2 show a few steps in a current process for forming a semiconductor device (e.g., transistor) on a silicon-on-insulator (SOI) wafer. In FIG. 1, contact material 20 has been deposited in a process of forming a contact 22 to the substrate 24. The contact 22 is formed in a shallow trench isolation (STI) region 26. After the insulating material 28 is deposited for the STI regions 26 in the current process, the excess STI material 28 is removed until the pad nitride layer 30 is reached (e.g., using chemical-mechanical polishing (CMP)). When the excess STI material 28 is removed using CMP, for example, and the CMP process is stopped at the pad nitride layer 30, the STI regions 26 are left with a dish-shaped surface 32 (i.e., concave surface) due to the different polishing rates for the STI material 28 and the pad nitride layer 30. Then, when the excess contact material 20 is removed down to the pad nitride layer 30, as shown in FIG. 2, the top surface 34 of the structure 36 is planar, but residual contact material 38 remains in the dish-shaped recess of the STI regions 26. This residual contact material 38 at the STI regions 26 is undesirable for at least two reasons. The ability of the STI region to provide isolation may be degraded because the residual contact material 38 is conductive. Also, from a device point of view, transistor width may be undesirably increased due to residual contact material buildup in the sidewall. Thus, a need exists for a way to eliminate this residual contact material 38 in the dished STI regions 32, and preferably without adding additional steps to the process flow.

SUMMARY OF THE INVENTION

The problems and needs outlined above are addressed by embodiments of the present invention. In accordance with one aspect of the present invention, a method of fabricating a semiconductor device is provided. This method includes the following the steps, the order of which may vary. An intermediate structure having a top surface is provided. An isolation trench is formed is the intermediate structure. Isolation material is deposited over the intermediate structure. The isolation material fills the isolation trench. Excess isolation material extends above the top surface of the intermediate structure. Part of the excess isolation material is removed until there is a predetermined thickness of isolation material remaining on the top surface of the intermediate structure. A contact opening is formed in the isolation material at the isolation trench. The contact opening extends through at least part of the intermediate structure. Contact material is deposited over the isolation material. The contact material fills the contact opening. Excess contact material, if any, that extends above the isolation material is removed. The excess isolation material is removed at least until the top surface of the intermediate structure is reached. The removal of the excess materials may be performed using chemical mechanical polishing. The intermediate structure may include a substrate, a bottom insulator layer, a semiconducting material layer, and a pad nitride layer, the bottom insulator layer being formed over the substrate, the semiconducting material layer being formed over the bottom insulator layer, and the pad nitride layer being formed over the semiconducting material layer.

In accordance with another aspect of the present invention, a method of fabricating a semiconductor device is provided. This method includes the following the steps, the order of which may vary. An intermediate structure is provided, which includes a substrate, a bottom insulator layer, a semiconducting material layer, and a pad nitride layer. The bottom insulator layer is formed over the substrate. The semiconducting material layer is formed over the bottom insulator layer. The pad nitride layer is formed over the semiconducting material layer. An isolation trench is formed in the pad nitride layer and the semiconducting material layer. An isolation material is deposited over the structure. The trenches are filled with the isolation material and excess isolation material extends above the pad nitride layer. Part of the excess isolation material is removed such that a predetermined thickness of the isolation material remains atop the pad nitride layer. A contact opening is formed in the isolation material within the isolation trench, extending through the bottom insulator layer, and opening to the substrate. A contact material is deposited over the structure. The contact material fills the contact opening and excess contact material extends above a top surface of isolation material. The excess contact material is removed down to the top surface of the isolation material. The excess isolation material is removed at least until the pad nitride layer is reached. The substrate may be doped at the contact opening to form a P+ implant region in the substrate. Such doping may be performed using a material selected from a group consisting of B and $BF_2$, for example.

In accordance with still another aspect of the present invention, a semiconductor device is provided, which includes isolation trenches and a contact. The isolation trenches are formed in a structure. The isolation trenches are filled with isolation material. The contact is formed through one of the isolation trenches and is filled with contact material. No residual contact material from forming the contact remains atop another trench of the isolation trenches.

BRIEF DESCRIPTION OF THE DRAWINGS

The following is a brief description of the drawings, which show illustrative embodiments of the present invention and in which.

DETAILED DESCRIPTION OF ILLUSTRATIVE EMBODIMENTS

Figure 1:
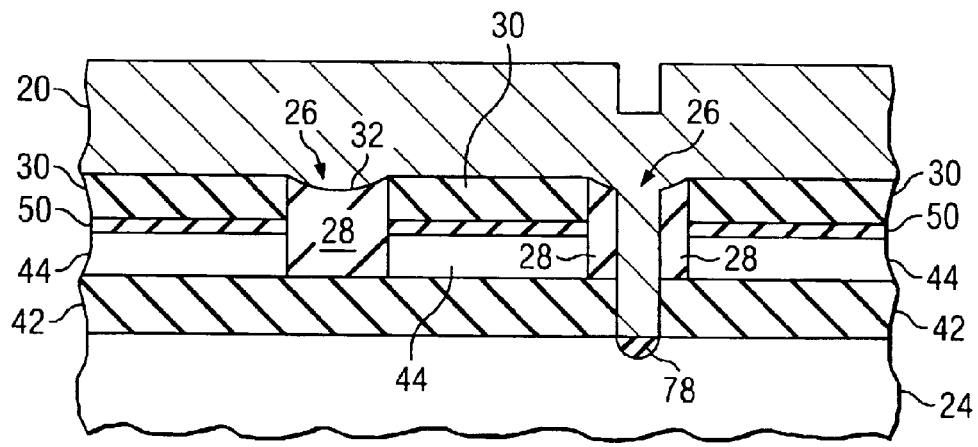
FIGS. 1 and 2 are cross-section views of intermediate structures during the fabrication of a semiconductor device to illustrate steps for a prior process.

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Next, an illustrative embodiment of the present invention will be described with reference to FIGS. 3–12. In FIGS. 3–12, process steps for an illustrative method of the present invention are shown. Not all of the processing steps for fabricating the example semiconductor device are shown, because some of the intermediate steps, as well as other steps before and after those shown, should be apparent to one of ordinary skill in the art. The particular device layout shown is merely one illustrative example for using a method of the present invention in forming a transistor. With the benefit of this disclosure, other possible device layouts that may benefit from incorporating a method and/or an embodiment of the present invention may be realized by one of ordinary skill in the art.

Figure 3:
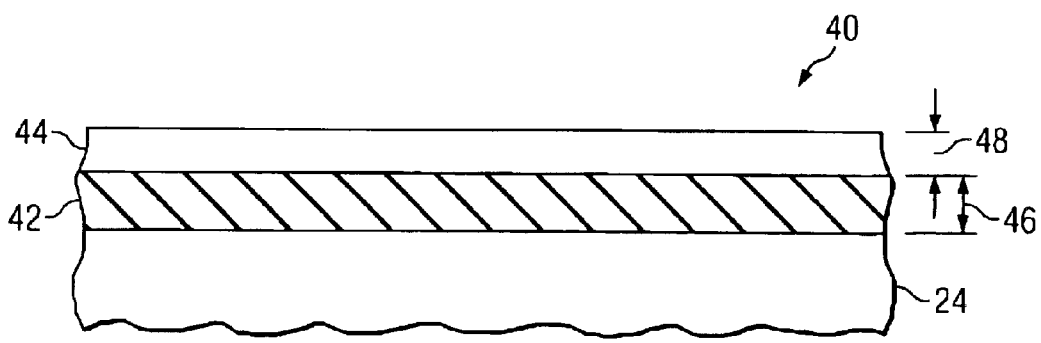
FIGS. 3–12 are cross-section views of intermediate structures during the fabrication of a semiconductor device to show steps of an illustrative embodiment of the present invention.

Beginning at FIG. 3, an initial wafer structure 40 is provided, which in this case includes a substrate 24, a bottom insulator layer 42, and a semiconducting material layer 44. The bottom insulator layer 42 is located over the substrate 24, and the semiconducting material layer 44 is located over the bottom insulator layer 42. Typically, the semiconducting material layer 44 is silicon. Hence, the wafer structure shown in FIG. 3 is often referred to as a silicon-on-insulator (SOI) wafer. For purposes of discussion, the wafer structure 40 shown in FIG. 3 may be referred to as an SOI wafer. However, the semiconducting material layer 44 may be made from a variety of materials, including but not necessarily limited to: silicon, silicon germanium, germanium, GaAs, or any combination thereof, for example. The bottom insulator layer 42 acts as an isolation layer between the semiconducting material layer 44 and the substrate 24. The bottom insulator layer 42 in an SOI wafer 40 is typically undoped oxide, such as silicon dioxide, for example. Hence, the bottom insulator layer 42 in an SOI wafer 40 is often referred to as a buried oxide layer (BOX). However, the bottom insulator layer 42 may be made from a variety of materials, including but not necessarily limited to: $SiO_2$, SiN, or any combination thereof, for example. The substrate 24 is typically made from silicon, for example; yet it may be made from other suitable materials as well. One of ordinary skill in the art will realize that there may be other suitable materials that may be substituted into an embodiment of the present invention. In a preferred embodiment, the bottom insulator layer 42 has a thickness 46 between about 800 and about 1500 Å, and the semiconducting material layer 44 has a thickness 48 between about 300 and about 800 Å, for example. However, other thicknesses 46, 48 may be used for these layers 42, 44.

Figure 4:
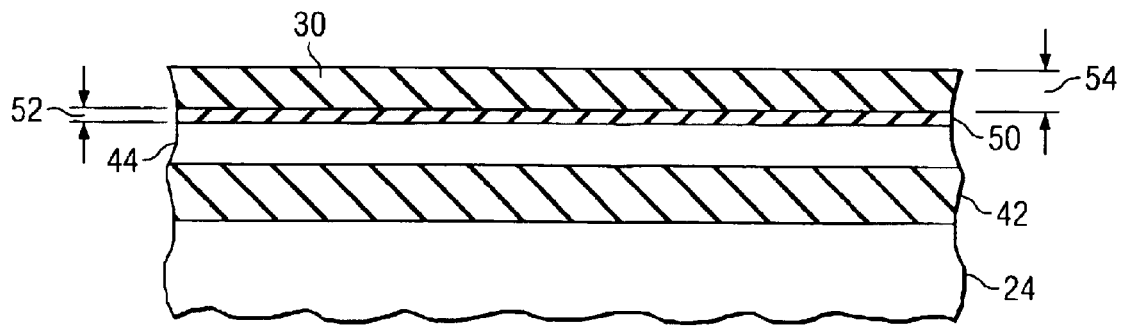

As shown in FIG. 4, a pad oxide layer 50 may be formed on the semiconducting material layer 44, and a pad nitride layer 30 may be formed on the pad oxide layer 50. In a preferred embodiment, the pad oxide layer 50 may be deposited by a furnace at a temperature between about 800° and about 1000° C. with a thickness 52 between about 70 and about 120 Å, and the pad nitride layer 30 may be deposited by a furnace at a temperature between about 700° and about 900° C. with a thickness 54 between about 600 and about 1200 Å, for example. However, other temperatures and thicknesses 52, 54 may be used for these layers 30, 50. The pad nitride layer 30 may be made from a variety of materials, including but not necessarily limited to: SiN (preferred), SiON, SiC, or any combination thereof, for example.

Figure 5:
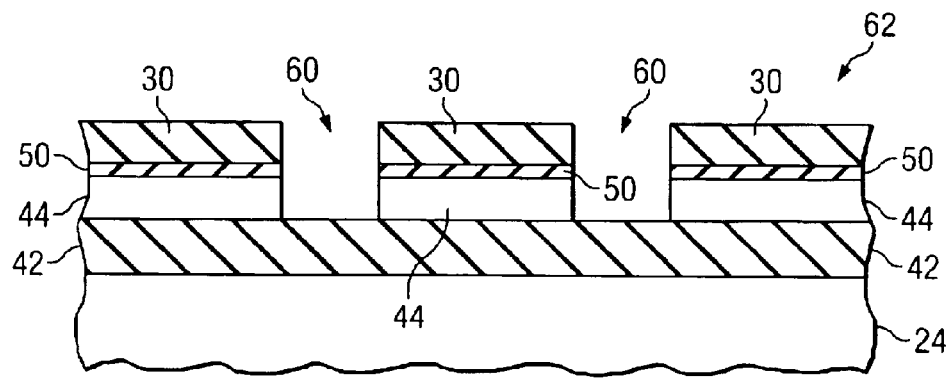
Figure 6:
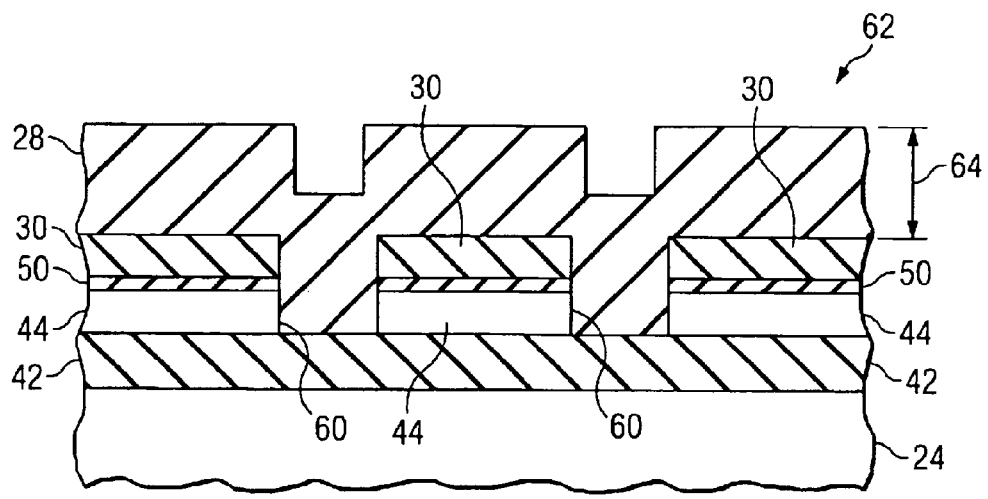

Next, isolation trenches 60 are formed (e.g., by conventional lithography and etching processes) in the intermediate structure 62 shown in FIG. 5 (e.g., in the pad nitride layer 30, pad oxide layer 50, and semiconducting material layer 44 in this case), and the trenches 60 may open to the bottom insulator layer 42. Isolation material 28 is then depositing over the intermediate structure 62, as shown in FIG. 6. The isolation material 28 fills the isolation trenches 60. Excess isolation material 28 extends above the pad nitride layer 30. In a preferred embodiment, for example, the isolation material 28 is formed using a high density plasma chemical vapor deposition (HDP-CVD) process to provide a thickness 64 between about 3500 and about 5000 Å, but other thicknesses may be formed in other embodiments. The isolation material 28 is preferably made from an undoped silicon glass (e.g., HDP oxide film), but other suitable materials may be substituted as well, including but not necessarily limited to: undoped polysilicon, oxide, spun-on dielectric material, flow oxide, or any combination thereof, for example.

Figure 7:
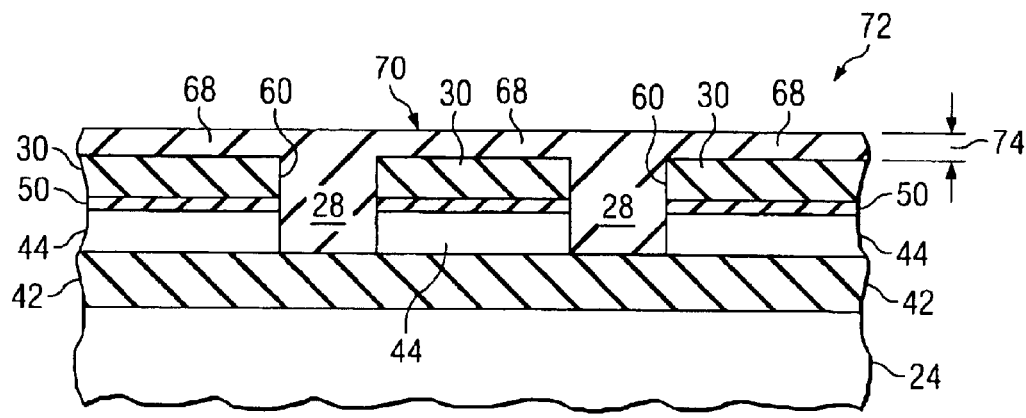

As shown in FIG. 7, part of the excess isolation material 28 is removed and a remaining part 68 of the isolation material 28 is still over the pad nitride layer 30. In a preferred embodiment, the excess isolation material 28 is removed using a CMP process to provide a planar top surface 70 for the structure 72, as shown in FIG. 7, for example. This may be referred to as an "under-polish step." In a prior method, the isolation material 28 would have been removed by CMP until the pad nitride layer 30 was reached, which typically causes the surface of the isolation material 28 to have a concave or dished shape, as discussed above regarding FIGS. 1 and 2. In a preferred embodiment of the present invention, the isolation material 28 has a remaining thickness 74 on top of the pad nitride layer 30 between about 500 and about 1000 Å, for example. Yet, in other embodiments of the present invention, the remaining thickness 74 may be greater or less than this preferred range. Leaving a remaining thickness 74 of the isolation material 68 atop the intermediate structure 62 under it (regardless of the intermediate structure there under) is one of the key steps to a method of the present invention, as will become more clear at the conclusion of this description.

Figure 8:
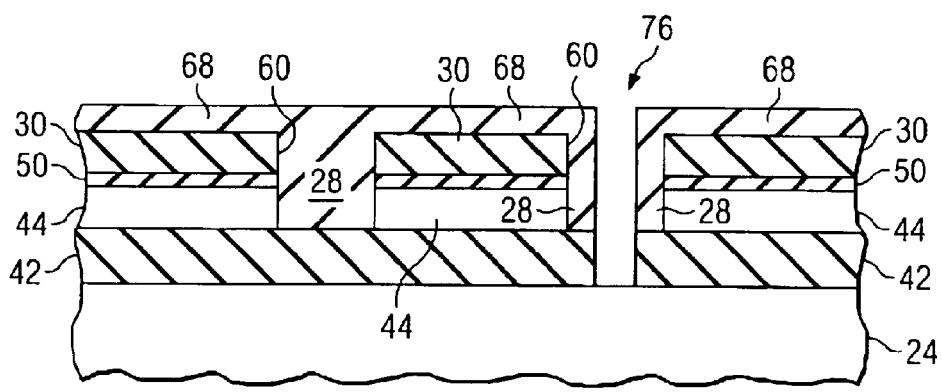
Figure 9:
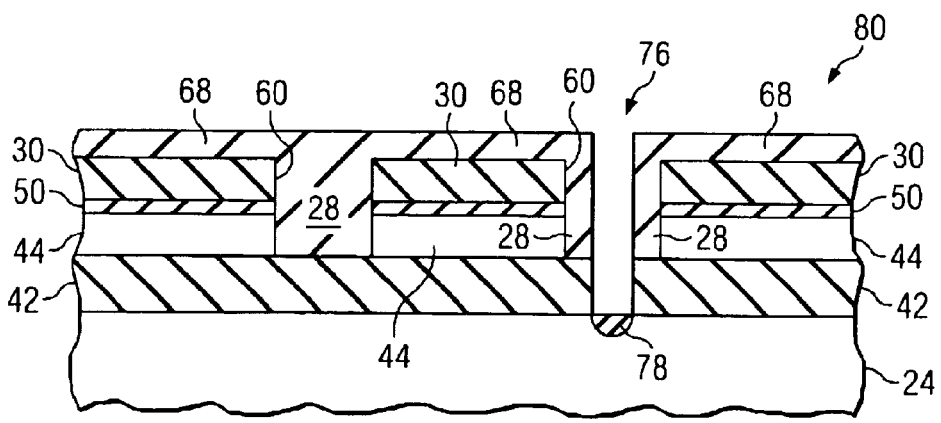

Referring to FIG. 8, a contact opening 76 is formed (e.g., by conventional lithography and etching processes) in the isolation material 28 at a trench 60. The contact opening 76 may be formed through the bottom isolator layer 42 opening to the substrate 24, as shown in FIG. 8. In this example device, the substrate 24 is doped (e.g., with B or $BF_2$) to provide a P+implant 78 at the contact opening 76 to reduce the resistance of the substrate 24 at this region 78, as shown in FIG. 9. But in other embodiments, other processes or other doping parameters may be implemented at the contact opening 76 before forming the contact.

Figure 10:
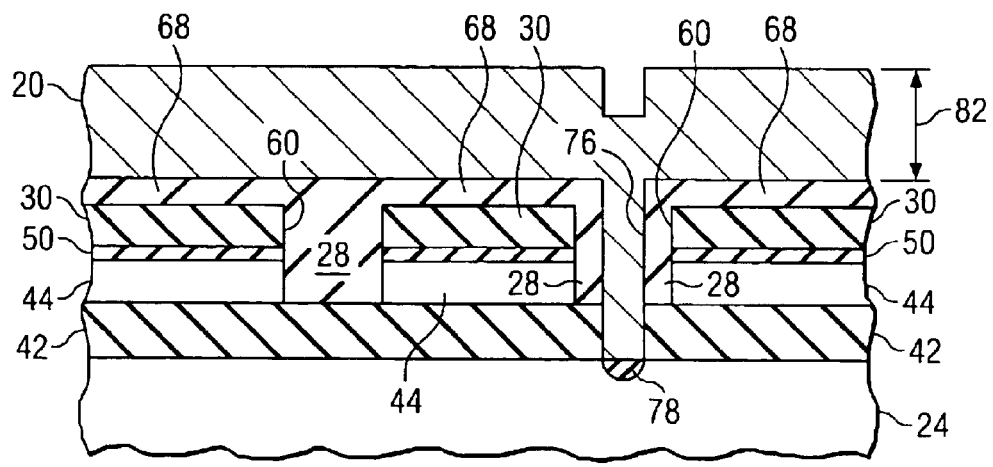

Referring to FIG. 10, contact material 20 is deposited over the intermediate structure 80 of FIG. 9. The contact openings 76 are filled with the contact material 20. Typically, excess contact material 20 will be built up outside of the contact openings 76, as shown in FIG. 10. This excess contact material 20 may have a thickness 82 between about 3500 and about 5800 Å, for example. The contact material 20 is preferably made from polysilicon that is at some point doped to be conductive, but other suitable materials may be substituted for the polysilicon in other embodiments, including (but not limited to): metal, tungsten, aluminum, aluminum copper, copper, or combinations thereof, for example. Preferably, the polysilicon has been deposited in a furnace with a temperature between about 500° and about 700° C., for example, but other deposition parameters may be used.

Figure 11:
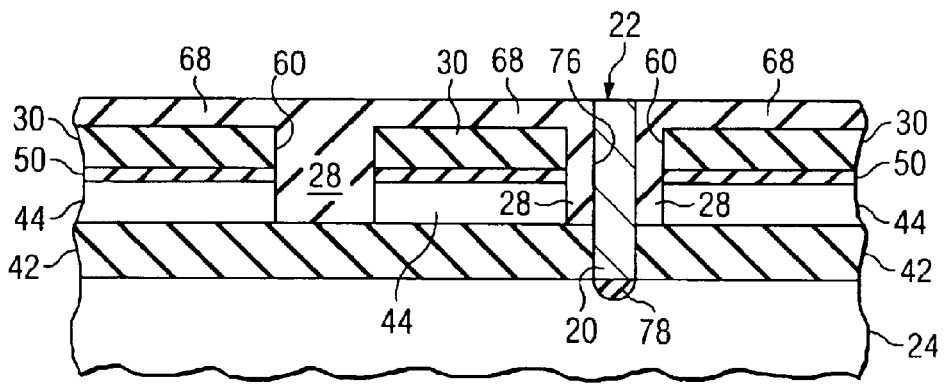
Figure 12:
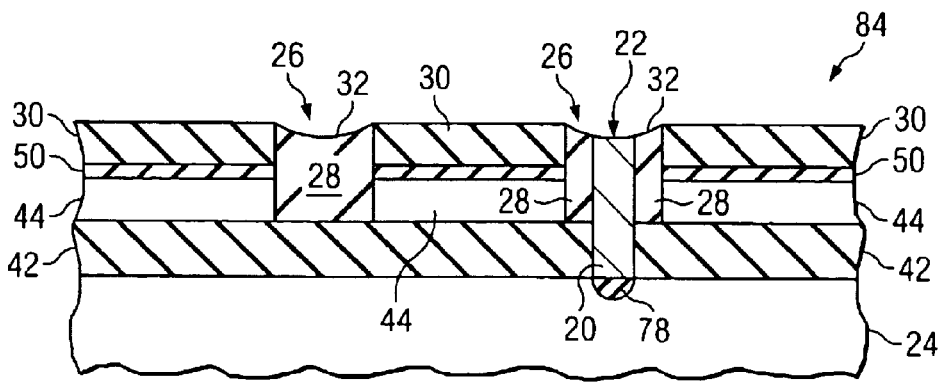

In FIG. 11, the excess contact material 20 has been removed (e.g., by CMP or etch back). If desired or required, the isolation material 68 may be removed or planarized (e.g., by CMP or etch back) down to the pad nitride layer 30. As shown in FIG. 12, the removal or planarization down to the pad nitride layer 30 (e.g., stopping on the pad nitride layer 30) may cause the isolation material 28 and/or the contact material 20 at the trenches 60 to have a concave or dished surface shape due to the different polishing rates or removal rates for these three materials (pad nitride layer 30, isolation material 28, and contact material 20). Such dishing may create a recess with a thickness between about 400 and about 800 Å at the wider isolation trenches with a area between about 80 μm by 100 μm and about 2000 μm by 2000 μm, for example. The removal of the remaining excess isolation material 68 over the pad nitride layer 30 may be performed by simply continuing the same CMP process used to remove the excess contact material 20, for example. If polysilicon is used for the contact material 20, it may be doped or implanted after the structure 84 of FIG. 12 is formed to make the contact 22 conductive, for example.

Figure 2:
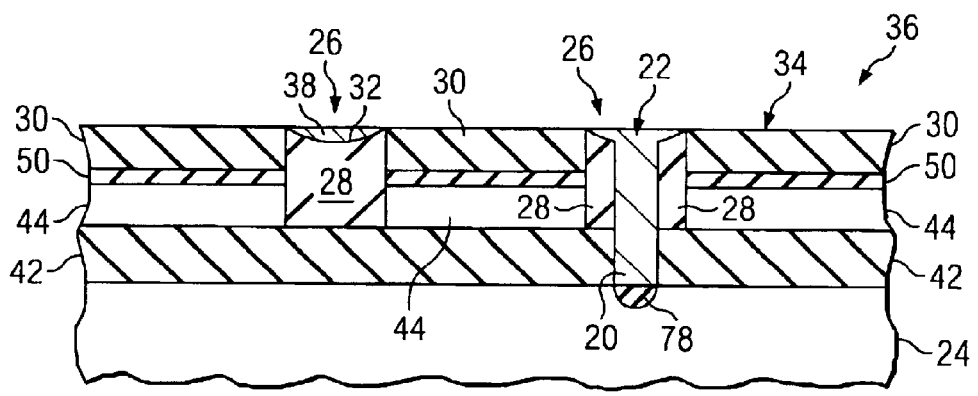

As FIG. 12 illustrates, using a method of the present invention provides an advantage that no residual contact material 38 is left in the dished region 32 on top of the isolation material 28, as compared to the prior method results shown in FIG. 2. Another advantage provided by a method of the present invention is that the residual contact material being left atop a dished STI region (see e.g., FIG. 2) is eliminated without adding extra processing steps. Other advantages of a method of the present invention include a decrease of the isolation material polish frequency and a decrease in the generation of scratches by the CMP processes, as will be apparent to one of ordinary skill in the art with the benefit of this disclosure. With the benefit of this disclosure, one of ordinary skill in the art will likely realize may other applications and uses of the present invention beyond the illustrative example described herein.

It will be appreciated by those skilled in the art having the benefit of this disclosure that embodiments the present invention provide methods of forming a contact in an isolation trench while also avoiding or eliminating the build-up of unwanted residual contact material atop other isolation trenches. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method of fabricating a semiconductor device, comprising:
   providing an intermediate structure having a top surface, wherein an isolation trench is formed is the intermediate structure;
   depositing isolation material over the intermediate structure, wherein the isolation material fills the isolation trench and wherein excess isolation material extends above the top surface of the intermediate structure;
   removing part of the excess isolation material until there is a predetermined thickness of isolation material remaining on the top surface of the intermediate structure;
   forming a contact opening in the isolation material at the isolation trench, wherein the contact opening extends through at least part of the intermediate structure;
   depositing contact material over the isolation material, wherein the contact material fills the contact opening;
   removing excess contact material, if any, that extends above the isolation material; and
   removing the excess isolation material ate least until the top surface of the intermediate structure is reached.

2. The method of claim 1, wherein the semiconductor device includes transistors.

3. The method of claim 1, wherein the isolation material is selected from a group consisting of undoped silicon glass, HDP oxide, undoped polysilicon, oxide, spun-on dielectric material, and flow oxide.

4. The method of claim 1, wherein the contact material comprises a material selected from a group consisting of polysilicon, metal, tungsten, aluminum, aluminum copper, copper, and combinations thereof.

5. The method of claim 1, wherein the predetermined thickness is between about 500 and about 1000 Å.

6. The method of claim 1, wherein the removing part of the excess isolation material is performed using chemical mechanical polishing.

7. The method of claim 1, wherein the removing excess contact material is performed using chemical mechanical polishing.

8. The method of claim 7, wherein the removing the excess isolation material until the top surface of the intermediate structure is reached, is performed by continuing the same chemical mechanical polishing process used to remove excess contact material.

9. The method of claim 1, wherein the removing the excess isolation material until the top surface of the intermediate structure is reached, is performed using chemical mechanical polishing.

10. The method of claim 1, wherein the intermediate structure comprises a substrate, a bottom insulator layer, a semiconducting material layer, and a pad nitride layer, the bottom insulator layer being formed over the substrate, the semiconducting material layer being formed over the bottom insulator layer, and the pad nitride layer being formed over the semiconducting material layer.

11. The method of claim 10, wherein the substrate comprises silicon.

12. The method of claim 10, wherein the bottom insulator layer is selected from a group consisting of undoped oxide, silicon dioxide, and silicon nitride.

13. The method of claim 10, wherein the semiconducting material layer is selected from a group consisting of silicon, silicon germanium, germanium, and GaAs.

14. The method of claim 10, wherein the intermediate structure further comprises a pad oxide layer located between the semiconducting material layer and the pad nitride layer.

15. A method of fabricating a semiconductor device, comprising:
   providing an intermediate structure comprising a substrate, a bottom insulator layer, a semiconducting material layer, and a pad nitride layer, wherein the bottom insulator layer is formed over the substrate, the semiconducting material layer is formed over the bottom insulator layer, and the pad nitride layer is formed over the semiconducting material layer;
   forming an isolation trench in the pad nitride layer and the semiconducting material layer;
   depositing an isolation material over the structure, wherein the trenches are filled with the isolation material and excess isolation material extends above the pad nitride layer;
   removing part of the excess isolation material such that a predetermined thickness of the isolation material remains atop the pad nitride layer;
   forming a contact opening in the isolation material within the isolation trench, extending through the bottom insulator layer, and opening to the substrate;
   depositing a contact material over the structure, wherein the contact material fills the contact opening and excess contact material extends above a top surface of isolation material;
   removing the excess contact material down to the top surface of the isolation material; and
   removing the excess isolation material at least until the pad nitride layer is reached.

16. The method of claim 15, further comprising:

doping the substrate at the contact opening to form a P+ implant region in the substrate.

17. The method of claim 16, wherein the doping is performed using a material selected from a group consisting of B and $BF_2$.

18. The method of claim 15, wherein the contact material comprises a material selected from a group consisting of polysilicon, metal, tungsten, aluminum, aluminum copper, copper, and combinations thereof.

19. The method of claim 18, further comprising:

doping the contact material to make it conductive.

20. The method of claim 15, wherein the semiconductor device includes transistors.

21. The method of claim 15, wherein the isolation material is selected from a group consisting of undoped silicon glass, HDP oxide, undoped polysilicon, oxide, spun-on dielectric material, and flow oxide.

22. The method of claim 15, wherein the predetermined thickness is between about 500 and about 1000 Å.

23. The method of claim 15, wherein the removing part of the excess isolation material is performed using chemical mechanical polishing.

24. The method of claim 15, wherein the removing excess contact material is performed using chemical mechanical polishing.

25. The method of claim 24, wherein the removing the excess isolation material until the pad nitride layer is reached, is performed by continuing the same chemical mechanical polishing process used to remove excess contact material.

26. The method of claim 15, wherein the intermediate structure further comprises a pad oxide layer located between the semiconducting material layer and the pad nitride layer.

* * * * *

UNITED STATES PATENT AND TRADEMARK OFFICE
CERTIFICATE OF CORRECTION

PATENT NO. : 6,930,040 B2 Page 1 of 1
DATED : August 16, 2005
INVENTOR(S) : Hou et al.

It is certified that error appears in the above-identified patent and that said Letters Patent is hereby corrected as shown below:

Column 5,
Line 17, remove "may".
Line 58, remove "ate" and insert -- at --.

Signed and Sealed this

Sixth Day of December, 2005

JON W. DUDAS
*Director of the United States Patent and Trademark Office*